(12) United States Patent
Jacobs et al.

(10) Patent No.: US 10,910,540 B2
(45) Date of Patent: Feb. 2, 2021

(54) SOLID STATE LIGHT EMITTER DIE HAVING A HEAT SPREADER BETWEEN A PLURALITY LEAD FRAME

(71) Applicant: SIGNIFY HOLDING B.V., Eindhoven (NL)

(72) Inventors: Boudewijn Jacobs, Eindhoven (NL); Willem Dirk Van Driel, Eindhoven (NL); Cornelis Van Der Marel, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/494,968

(22) PCT Filed: Mar. 28, 2018

(86) PCT No.: PCT/EP2018/057874
§ 371 (c)(1),
(2) Date: Sep. 17, 2019

(87) PCT Pub. No.: WO2018/184928
PCT Pub. Date: Oct. 11, 2018

(65) Prior Publication Data
US 2020/0035893 A1 Jan. 30, 2020

(30) Foreign Application Priority Data

Apr. 4, 2017 (EP) ..................... 17164685

(51) Int. Cl.
*H01L 23/34* (2006.01)
*H01L 23/10* (2006.01)
(Continued)

(52) U.S. Cl.
CPC ...... *H01L 33/644* (2013.01); *H01L 23/49537* (2013.01); *H01L 23/49541* (2013.01);
(Continued)

(58) Field of Classification Search
CPC ......... H01L 23/49541; H01L 23/49575; H01L 23/49537; H01L 33/644; H01L 24/16;
(Continued)

(56) References Cited

U.S. PATENT DOCUMENTS 7,291,866 B2 * 11/2007 Oshio ..................... H01L 33/62
257/99
8,659,050 B2 * 2/2014 Seo ................... H01L 23/49541
257/99

(Continued)

*Primary Examiner* — Alonzo Chambliss
(74) *Attorney, Agent, or Firm* — Daniel J. Piotrowski (57) ABSTRACT

A solid state light emitter package (200), a lamp, a luminaire and a method of manufacturing the solid state light emitter package are provided. The solid state light emitter package comprising a solid state light emitter die (230), a first and second lead frame (210, 220), an electrical insulating material (242, 244), a thermal element (250) and a bridging element (260). The first and second lead frame are electrically isolated from each other and provide power to said die. Said die is at least partially provided on the first lead frame. The thermal element is in between the first and second lead frame and is electrically isolated by the electrical insulating material from said lead frames. The thermal element is at least one of a heat absorber or a heat spreader. The bridging element bridges the electrical insulating material and the thermal element and provides an electrical connection between said die and the second lead frame.

13 Claims, 7 Drawing Sheets

(51) Int. Cl.
*H01L 33/00* (2010.01)
*H01L 31/0232* (2014.01)
*H01L 23/495* (2006.01)
*H01L 21/00* (2006.01)
*H01L 33/64* (2010.01)
*H01L 23/00* (2006.01)
*H01L 33/48* (2010.01)
*H01L 33/62* (2010.01)

(52) U.S. Cl.
CPC ........ *H01L 23/49575* (2013.01); *H01L 24/16* (2013.01); *H01L 24/48* (2013.01); *H01L 33/483* (2013.01); *H01L 33/62* (2013.01); *H01L 33/642* (2013.01); *H01L 33/641* (2013.01); *H01L 2224/16245* (2013.01); *H01L 2224/48245* (2013.01); *H01L 2933/0066* (2013.01); *H01L 2933/0075* (2013.01)

(58) Field of Classification Search
CPC ....... H01L 24/48; H01L 24/483; H01L 33/62; H01L 33/642
See application file for complete search history.

(56) References Cited

U.S. PATENT DOCUMENTS

| | | | |
|---|---|---|---|
| 9,240,535 | B2 | 1/2016 | Yoshida et al. |
| 9,349,929 | B2 | 5/2016 | Clark et al. |
| 2006/0220048 | A1* | 10/2006 | Matsumoto ........... H01L 33/647 257/98 |
| 2008/0012026 | A1 | 1/2008 | Tsuji |
| 2008/0012035 | A1 | 1/2008 | Wang et al. |
| 2008/0012036 | A1 | 1/2008 | Loh et al. |
| 2009/0219726 | A1 | 9/2009 | Weaver et al. |
| 2013/0146912 | A1 | 6/2013 | Su et al. |

* cited by examiner (Prior art)

Fig. 1a

(Prior art)

SOLID STATE LIGHT EMITTER DIE HAVING A HEAT SPREADER BETWEEN A PLURALITY LEAD FRAME

CROSS-REFERENCE TO PRIOR APPLICATIONS

This application is the U.S. National Phase application under 35 U.S.C. § 371 of International Application No. PCT/EP2018/057874, filed on Mar. 28, 2018, which claims the benefit of European Patent Application No. 17164685.4, filed on Apr. 4, 2017. These applications are hereby incorporated by reference herein.

FIELD OF THE INVENTION

The invention relates to a solid state light emitter package. The invention further relates to a lamp and to a luminaire comprising an embodiment of the solid state light emitter package.

The invention also relates to a method of manufacturing a solid state light emitter package.

BACKGROUND OF THE INVENTION

Light Emitting diode (LED) dies are often packaged in a LED package before being used in a lighting application. During the lifetime of the LED die and LED package it may be that, at a certain point in time, elements of the LED package become too hot, that these or other elements of the LED package may carbonize under the influence of the heat, and as a consequence of a short circuit the LED package may catch fire. There is a strong need to prevent this and manufacture LED packages that are safe, even in cases of overheating.

U.S. Pat. No. 9,240,535B2 describes a light-emitting-element mount substrate that should have good heat release properties. The light-emitting-element mount substrate is an element that is used to couple, for example, a light emitting diode die to external electrical connections. The light-emitting-element mount substrate comprises a sort of substrate plate that is formed by electrically conductive first and second substrate bodies that are electrically isolated from each other. The light emitting element is provided at one side of the substrate plate and the light emitting element is electrically coupled at first location to the first substrate body and at a second location to the second substrate body. At another side of the substrate plate contact electrodes are provided for connecting respective substrate bodies to external power.

US 2008/012036 A1 discloses a modular package for a light emitting device which includes a leadframe including a first region having a top surface, a bottom surface and a first thickness and a second region having a top surface, a bottom surface and a second thickness that is less than the first thickness. The leadframe further includes an electrical lead extending laterally away from the second region, and the package further includes a thermoset package body on the leadframe and surrounding the first region. The thermoset package body may be on both the top and bottom surfaces of the second region. A leak barrier may be on the leadframe, and the package body may be on the leak barrier. US 2013/146912 A1 discloses an electronic device which includes an insulating substrate, a plurality of conductive vias and a chip. The insulating substrate has an upper surface and a lower surface opposite to each other. The conductive vias pass through the insulating substrate. The chip is disposed on the upper surface of the insulating substrate and includes a chip substrate, a semiconductor layer and a plurality of contacts. The semiconductor layer is located between the chip substrate and the contacts. The contacts are electrically connected to the conductive vias. The material of the insulating substrate and the material of the chip substrate are the same.

US 2009/219726 A1 discloses a phase change material (PCM) which is used for thermal storage for LED-based lighting systems. The PCM is placed in a sealed container in close contact with the LED to be cooled. The PCM is selected such that its melting point temperature is approximately the preferred operating temperature of the LED. When the PCM absorbs heat from the LED as a solid, its temperature rises. However, when the PCM reaches its melting point, the temperature of the PCM stays at its melting point temperature until the phase of the PCM changes completely from a solid to a liquid. Then the PCM continues to rise in temperature. Because a PCM can absorb a large amount of heat during its change of phase from a solid to a liquid, the PCM can store a large amount of heat generated by the LED while maintaining its melting point temperature.

SUMMARY OF THE INVENTION

In practical embodiments, it may be that the light emitting element of the cited US patent is a LED and in practical embodiments the electrical isolation between the substrate bodies is made of a synthetic (for example, plastic) material. A problem with such a light-emitting-element mount substrate is that, for example, the connection of the LED to one of the substrate bodies becomes high ohmic as the result of, for example, corrosion or damage as the result of, for example, an electrostatic discharge (ESD) event. Driving circuits of LEDs generate, in general, a constant current and if the connection of light emitting element to one of the substrate bodies becomes high ohmic, then the voltage over the high ohmic connection will raise. As a consequence more power will be dissipated in the high ohmic connection and one of the substrate bodies of the light-emitting-element of the US patent will reach a relatively high temperature. Such a temperature may become high enough to carbonize the plastic isolation material between the two substrate bodies. Then the light-emitting-element mount substrate may short circuit and as a result of generated heat generated during the short circuit the light-emitting-element mount substrate or the housing around the light-emitting-element mount substrate may catch fire.

It is an object of the invention to provide a safer solid state light emitter package.

For this purpose, according to an aspect of the invention, a solid state light emitter package is provided that comprises a solid state light emitter die, a first lead frame, a second lead frame, a bridging element, electrically insulating material and a thermal element. The first and second lead frame are electrically isolated from each other. The lead frames are for receiving power from an external power source and are arranged to provide the received power to the solid state light emitter die. The solid state light emitter die is at least partially provided on the first lead frame. The thermal element is arranged in between the first lead frame and the second lead frame and is electrically isolated by the electrical insulating material from the first lead frame and from the second lead frame. The thermal element is at least one of a heat absorber or a heat spreader. The thermal element is not in direct thermal contact with the solid state light emitter die.

The bridging element bridges the electrical insulating material and the thermal element in between the first lead frame and the second lead frame and is for obtaining an electrical connection between the solid state light emitter die and the second lead frame.

For this purpose, according to a further aspect of the invention, a method of manufacturing a solid state light emitter package is provided. The method comprises a) obtaining a first lead frame, a second lead frame, a solid state light emitter die, electrical insulating material and a thermal element, said lead frames being capable of receiving power and conducting the power to the solid state light emitter die, the thermal element being capable of absorbing heat or being capable of spreading heat, the thermal element not being in direct thermal contact with a solid state light emitter die; b) optionally obtaining a bridging element; c) arranging the first lead frame, the second lead frame, the thermal element and the electrical insulating material such that the first lead frame and the second lead frame are electrically isolated from each other, such that the thermal element is arranged in between the first lead frame and the thermal element is electrically isolated from the first lead frame and the second lead frame by the electrically insulating material; d) arranging the solid state light emitter die in the solid state light emitter package whereby at least a part of the solid state light emitter die is arranged on the first lead frame; and the method comprises one of: e1) arranging the bridging element, seen in a top view, above the thermal element and the electrically insulating material and arranging the bridging element in contact with the second lead frame and the solid state light emitter die for providing an electrical connection between the second lead frame and the solid state light emitter die, and e2) arranging the solid state light emitter die, seen in a top view, above the thermal element and the electrically insulating material and also partially on the second lead frame for an electrical connection between the solid state light emitter die and the second lead frame, wherein the part of the solid state light emitter die that is arranged on the first lead frame is also electrically connected to the first lead frame. Seen in a virtual plane that follows top surfaces of the first lead frame and the second lead frame, the thermal element at least partially encloses the first lead frame or the second lead frame to delay heat transfer between the first lead frame and the second lead frame.

The solid state light emitter package or the manufactured solid state light emitter package are more safe then known solid state light emitter packages because the risk of carbonizing of all electrical insulating material isolators is reduced. If one of the lead frames is becoming relatively hot, for example, because of a relatively high ohmic contact between one of the lead frames and an element that is electrically connected to the lead frame, then the heat is absorbed or spread by the thermal element before the heat is capable of fully carbonizing the whole structure in between the first lead frame and the thermal element and in between the thermal element and the second lead frame. Thereby the risk of a short circuit and, thus, a burning solid state light emitter package is reduced. Additionally, the thermal element is an additional element in between the first lead frame and the second lead frame and the thermal element is electrically isolated from the first lead frame and the second lead frame and, thus it has a floating voltage (assuming that it is partially electrical conductive). Thereby a gap between the first lead frame and the second lead frame is larger and, thus, a higher voltage difference between the first lead frame and the second lead frame is needed before a short circuit between them can occur. In other words, the increased distance also contributes to a lower risk of a short circuit and, thus, a burning solid state light emitter package.

If the thermal element is a heat absorber it is clear that more heat must be generated before this is all transferred through all the materials that are in between the first lead frame and the second lead frame and that, thereby, the risk of carbonization along a shortest path between the first lead frame and the second lead frame is reduced and at least delayed. Often a high ohmic connection is located in a relatively small area and, thus, the heat is generated in a relatively small area. Along the shortest thermal path to an opposing lead frame the electrical insulator can carbonize because of the very high local temperatures. The shortest thermal path from this relatively small area towards an opposing lead frame can be interrupted by a heat spreader. The heat spreader better spreads the heat along a larger volume and, as such, the highest occurring temperature is reduced. A reduced highest occurring temperature reduces the risk of carbonization between a path between the first lead frame and the second lead frame and, thereby, the risk of a short circuit and/or a burning solid state light emitter package is reduced.

Optionally, edge of the first lead frame is arranged opposite to one edge of the second lead frame and all shortest paths from the one edge of the first lead frame to the one edge of the second lead frame intersect with the thermal element. Optionally, the first edge is arranged parallel to the second edge. Thus, in other words, along the whole (parallel) portions of the first edge and the second edge the thermal element extends in between the first lead frame and the second lead frame. Thereby it is prevented that heat generated in one lead frame can be easily transferred towards the other lead frame thereby having the risk that all material in between the two lead frames carbonizes.

Seen in a virtual plane that follows top surfaces of the first lead frame and the second lead frame, the thermal element at least partially encloses the first lead frame or the second lead frame to delay heat transfer between the first lead frame and the second lead frame. Optionally, seen in a virtual plane that follows top surfaces of the first lead frame and the second lead frame, the thermal element at least partially encloses the first lead frame or the second lead frame from two or more sides. Optionally, seen in a virtual plane that follows top surfaces of the first lead frame and the second lead frame, the thermal element at least partially encloses the first lead frame or the second lead frame from three or more sides. Optionally, seen in a virtual plane that follows top surfaces of the first lead frame and the second lead frame, the first lead frame or the second lead frame is completely surrounded by the thermal element. If one of the lead frames is at least partially enclosed by the thermal element it is better prevented that heat generated in one lead frame can be easily transferred towards the other lead frame thereby having the risk that all material in between the two lead frames carbonizes.

Optionally, the material of the thermal element and the material of first lead frame may be different. Optionally, the material of the thermal element and the material of second lead frame may be different. Optionally, the material of the first lead frame and the material of second lead frame may be the same.

Optionally, the seen in a virtual plane that follows top surfaces of the first lead frame and the second lead frame, the thermal element at least partially encloses the first lead frame or the second lead frame for at least 60%. Optionally, the seen in a virtual plane that follows top surfaces of the first lead frame and the second lead frame, the thermal element at least partially encloses the first lead frame or the second lead frame for at least 70%. Optionally, the seen in a virtual plane that follows top surfaces of the first lead frame and the second lead frame, the thermal element at least partially encloses the first lead frame or the second lead frame for at least 80%.

Optionally, the solid state light emitter package comprises a housing component, the housing component being arranged to support the first lead frame, the second lead frame, the thermal element and optionally the solid state light emitter die, and, optionally, the housing component forming the electrically insulating materials in between the first lead frame, the thermal element and the second lead frame. This housing components may form the basis of the whole solid state light emitter package and may also fulfill the function of providing the electrically insulating materials. The housing component may a made by means of a molding technology.

Optionally, the thermal element is a thermal mass having a high volumetric heat capacitance and, optionally, the thermal element is made of a phase change material. These materials provide good heat absorbing properties thereby providing an advantageous thermal element. Optionally, the thermal element is made of material having a relatively high thermal conductivity coefficient and, optionally, the thermal element is made of a thermally conductive metal. These materials provide good heat conductive properties and thereby providing an advantageous thermal element. The thermal conductivity is, for example, larger than 200 W/mK.

Optionally, the thermal element has a thermal resistance to the surroundings of the solid state light emitter package that is lower than 40K/W. Thereby, if the thermal element receives heat, it is well capable of conducting this heat towards and providing the heat to the surroundings of the solid state light emitter package. Then it is prevented that heat generated in one lead frame can be easily transferred towards the other lead frame.

For this purpose, according to further aspects of the invention, a lamp and a luminaire are provided that comprises an embodiment of the above discussed solid state light emitter package. The luminaire may also comprise a lamp according to the further aspects of the invention.

Further preferred embodiments of the package and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of examples in the following description and with reference to the accompanying drawings, in which.

The figures are purely diagrammatic and not drawn to scale. In the Figures, elements which correspond to elements already described may have the same reference numerals.

DETAILED DESCRIPTION OF EMBODIMENTS

Figure 1A:
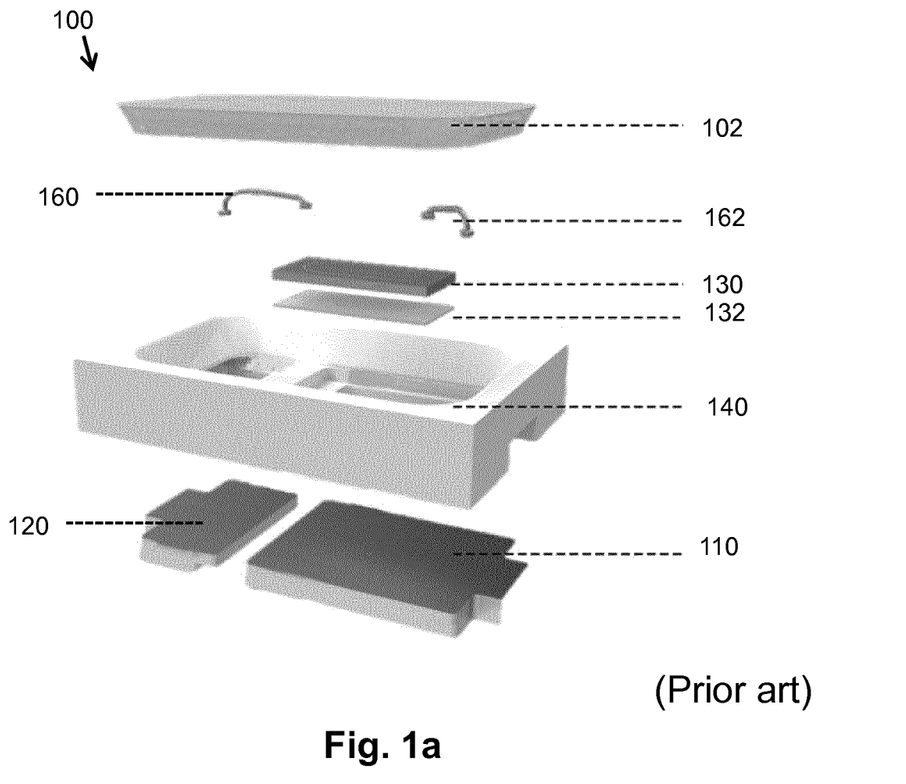
FIG. 1a shows an exploded view of a prior art solid state light emitter package, FIG. 1b schematically shows a top view of the prior art solid state light emitter package, FIG. 2a schematically shows a top view of a first embodiment of a solid state light emitter package, FIG. 2b schematically shows a cross-sectional view of the first embodiment of the solid state light emitter package of FIG. 2b along line IIb-IIb', FIG. 3a schematically shows a top view of a second embodiment of a solid state light emitter package, FIG. 3b schematically shows a cross-sectional view of the second embodiment of the solid state light emitter package of FIG. 3a along line IIIb-IIIb', FIG. 4a schematically shows a top view of a third embodiment of a solid state light emitter package, FIG. 4b schematically shows a top view of a fourth embodiment of a solid state light emitter package, FIG. 5a schematically shows a top view of a fifth embodiment of a solid state light emitter package, FIG. 5b schematically shows a top view of a sixth embodiment of a solid state light emitter package, FIG. 6 schematically shows a lamp, and FIG. 7 schematically shows a luminaire.

FIG. 1a shows an exploded view of a prior art solid state light emitter package 100. The prior art solid state light emitter package 100 comprises phosphor, a molding component 140 of a plastic material which forms a housing, a support for and an electrically isolator between different elements of the solid state light emitter package 100. The prior art solid state light emitter package 100 further comprises a first lead frame 110, a second lead frame 120, solid state light emitter die 130, an die attachments layer 132, a first bonding wire 162 and a second bonding wire 160. If the solid state light emitter package 100 is assembled, the lead frames 110, 120 are supported by the molding component 140 and the molding component provides an electrically insulating volume between the lead frames 110, 120. The solid state light emitter die 130 is provided with the die attachment layer 132 on the first lead frame 110. The die attachment layer 132 electrically isolates the solid state light emitter die 130 from the first lead frame 110 it must be noted that in many practical cases a bottom part of a solid state light emitter die 130 is an approximate 0.1 mm thick layer of electrically insulating $Al_2O_3$. The solid state light emitter die 130 is a specific type of die that has to receive driving power at the top surface, which is the same surface through which most of the light is emitted. The bounding wires 160, 162 are for electrically coupling the solid state light emitter die to the second lead frame 120 and the first lead frame 110, respectively. The lead frames 110, 120 provide connection areas at the outside of the solid state light emitter package 100 for receiving power for the solid state light emitter die 130. This power is transferred via the lead frames 110, 120 and the bonding wires 162, 160 to the solid state light emitter die 130. The solid state light emitter package 100 also has a phosphor 102 that comprises a luminescent material that converts, in use, a portion of the light emitted by the solid state light emitter die 130 towards light of another color.

Figure 1B:
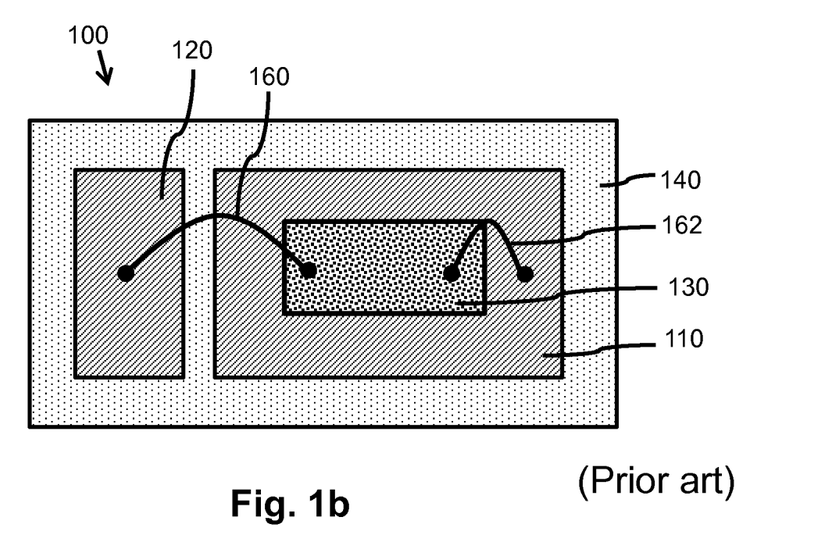

FIG. 1b schematically shows a top view of the prior art solid state light emitter package 100. The top view is obtained via a viewing direction towards the phosphor 102 and further towards the lead frames 110, 120. In the top view the phosphor 102 is not shown. Schematically the subsequent elements can be seen: the molding component 140, the first lead frame 110, the second lead frame 120, the solid state light emitter die 130 that is provided on the first lead frame 110 and the first and second bonding wire 160, 162.

In different circumstances, for example, because of corrosion, chemical influences and/or an ESD event, the coupling between the second bonding wire 160 and the second lead frame 120 may become high ohmic. Often a fixed current is driven through a solid state light package and then the voltage across the coupling between the second bonding wire 160 and the second lead frame 120 raises and quite a lot of power may be dissipated in the coupling between the second bonding wire 160 and the second lead frame 120. Often the thermal resistance of the second lead frame 120 is not large enough to conduct this heat away to prevent too high temperatures at the borders of the second lead frame 120. Consequently, a portion of the molding component 140 that is in between the first lead frame 110 and the second lead frame 120 may become too hot and may even carbonize. This may lead to a short-circuit between the first lead frame 110 and the second lead frame 120 which may subsequently result in a solid state light emitter package that catches fire.

Figure 2A:
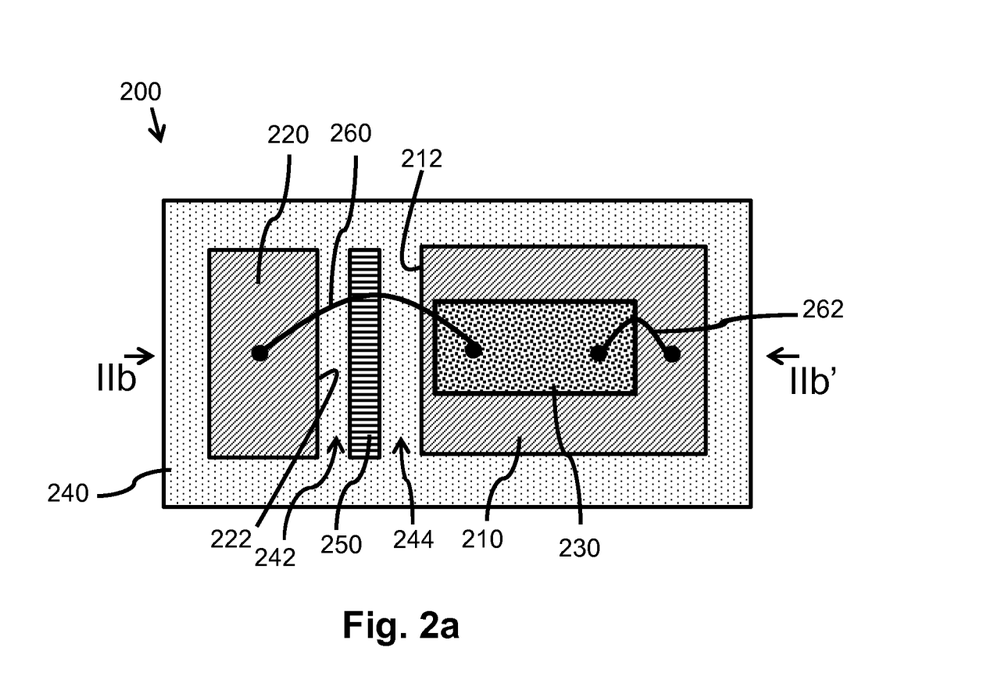

FIG. 2a schematically shows a top view of a first embodiment of a solid state light emitter package 200 according to an aspect of the invention. The solid state light emitter package comprises a solid state light emitter die 230, a first lead frame 210, a second lead frame 220, an electrical insulating material 242, 244 (being formed by material of a support element 240 of the solid state light emitter package 200), a thermal element 250, and a second bonding wire 260. Optionally, a first bonding wire 262 is provided.

Figure 2B:
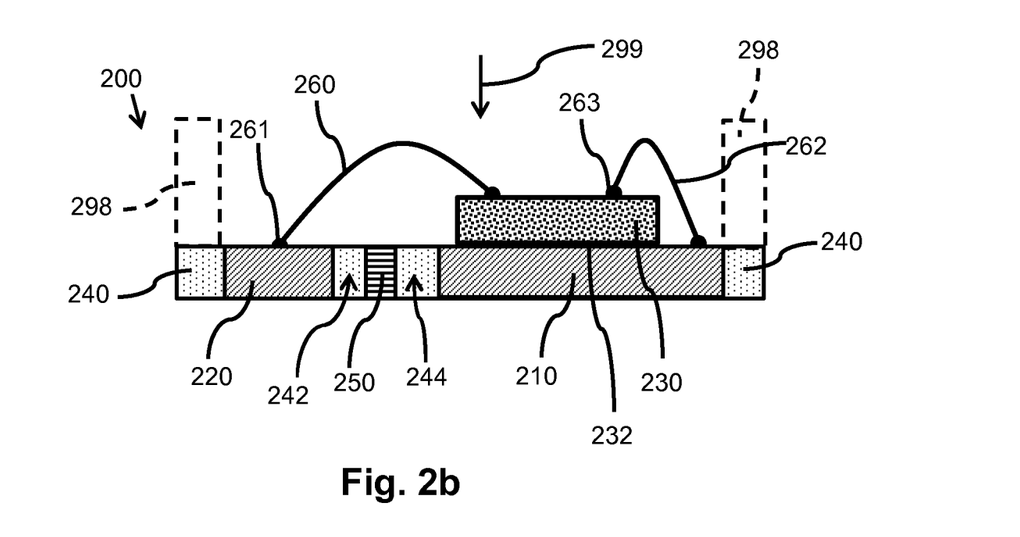

The top view is along a view direction towards a side of the first lead frame 210 on which the solid state light emitter die 230 is provided. In FIG. 2b an arrow 299 is drawn that indicates the viewing direction along which the top view of FIG. 2a is obtained. In subsequent embodiments, the top view is obtained along an equal or similar viewing direction.

The solid state light emitter die 230 may be a Light Emitting Diode (LED) die, but may also be another type of solid state light emitter such as a laser diode. In the top view, the solid state light emitter die 230 is provided on/in front of the first lead frame 210. If the first bonding wire 262 is present, the solid state light emitter die 230 is electrically isolated from the first lead frame 210 and may receive power from the first lead frame 210 via the first bonding wire 262. If the first bonding wire 262 is not present, a portion of the bottom surface of the solid state light emitter die 230, or the whole bottom surface of the solid state light emitter die 230, is arranged in electrical contact with the first lead frame 210, which may imply that an attachment material is provided in between the solid state light emitter die 230 and the first lead frame 210 that is electrically conductive in such embodiments.

The first lead frame 210 and the second lead frame 220 are made of an electrically conductive material. The material of which the first lead frame 210 and the second lead frame 220 are manufactured may also have relatively high thermal conductivity. Examples of such materials are metals, such as, for example, iron, aluminum, copper, etc. The first lead frame 210 and the second lead frame 220 may be made of a first electrically conductive material and may have another thin electrically conductive material as a coating at their surfaces. The first lead frame 210 and the second lead frame 220 may of a material that well conducts heat. A thermal resistance of the first lead frame 210 is often smaller than a thermal resistance of the second lead frame 220. The first lead frame 210 and the second lead frame 220 may extend towards a bottom surface of the solid state light emitter package 200 as is shown, for example, in FIG. 2b. At the bottom surface of the solid state light emitter package 200, the lead frames can be coupled to an external power source that provides driving power for the solid state light emitter die 230. The top surfaces (which are the presented surfaces in FIG. 2a and on which, for example, the solid state light emitter die 230 is provided) of the first lead frame 210 and the second lead frame 220 may be light reflective to prevent that impinging light is absorbed to prevent that the top surfaces of the lead frames 210, 220 contribute to an inefficiency of the solid state light emitter package 200.

A definition of a lead frame may be that a lead frame is a metal structure that carries signals to the outside or carries power towards the die. Often the die is glued to the lead frame and a bond wire is used to attach a pad of the die to the lead frame.

As depicted in FIG. 2b, the thermal element may protrude completely through the electrically insulating layer. It will lead to an even more safer solid state light emitter package.

In between the first lead frame 210 and the second lead frame 220 is provided a thermal element 250. The thermal element 250 is electrically isolated from the first lead frame 210 by the electrically insulating material 244 and is electrically isolated from the second lead frame 220 by means of electrically insulating material 242. The electrically insulating material 242 and/or electrically insulating material 244 may be made of a synthetic material and/or may be made of material that has a relatively low thermal conductivity coefficient. The synthetic material may be plastic material. Thus, under normal operational conditions (which means: no malfunctioning elements in the solid state light emitter package 200), the heat exchange between the first lead frame 210 and the thermal element 250 and/or the heat exchange between the second lead frame 220 and the thermal element 250 is relatively low. However, if the temperature of one of the lead frames 210, 220 significantly raises, the temperature of one of the electrically insulating materials 242, 244 will raise as well and the thermal element 250 may receive a relatively high portion of heat. The thermal element 250 is a heat absorber or a heat spreader.

If the thermal element 250 is a heat absorber it has a relatively high thermal capacitance and, consequently, it takes a relatively long time before the temperature of the thermal element 250 raises above unacceptable levels when it receives heat from, for example, a too hot first lead frame 210 or a too hot second lead frame 220. Thus, it takes a much longer time before the temperature of the electrically insulating material 242, 244 at the other side of the thermal element 250 than the side where the heat is generated raises to a too high level that leads to carbonization. Thereby the solid state light emitter package 200 becomes more safe because the time before a short-circuit can occur increases and during this longer interval of time it may be that, for example, one of the bonding wires 260, 262 that has a high ohmic coupling to one of the lead frames 220, 210 detaches thereby interrupting the generation of heat. Suitable materials for use as the heat absorbing thermal element 250 are materials with a relatively high volumetric thermal capacitance or materials that absorb at a certain temperature a relatively high amount of energy. Phase change materials are suitable material because, under normal operational conditional circumstances they are a solid material and if the temperature of the material raises up to a specific level, then the material absorbs quite a lot of heat as part of the process of the phase change from a solid material to a liquid material or a material of a different crystalline structure. Examples are, for example, different types and/or mixtures of paraffin. Such phase change materials may be provided in an enclosed space that prevents that the material flows away if it becomes a liquid.

If the thermal element 250 is a heat spreader, the received heat is spread over a relatively large volume and, then, the overall temperature raise can be kept within acceptable limits instead of having a hot spot that causes local carbonizations of electrical insulating material. In other words, if the thermal element 250 is a heat spreader, it is capable of conducting heat away from the heat source and provide it more easily and along a larger surface to the surrounding materials. Thereby the heat source is better cooled. Heat spreaders have, in general, a relatively low thermal resistance and, therefore, relatively low temperature differences are present in the thermal element 250. Advantageous material are, for example, metals. Many metals have a relatively high thermal conductivity, for example, larger than 200 W/mK. Suitable materials are, for example, aluminum, silver and copper.

It is to be noted that the thermal element 250 may also be a combination of a heat spreader and a heat absorber. Either the material that is used has characteristics of a heat absorber and a heat spreader, or two separate materials are combined: the thermal element 250 may comprise a heat spreading material (e.g. a metal) that spreads the received heat towards a heat absorbing materials (e.g. a phase change material).

Additionally, the thermal element 250 may have a top surface (which is the surface that is shown in FIG. 2a) that is light reflective. In use, light that is emitted by the solid state light emitter die 230 may impinge on the thermal element 250 and is not absorbed, but reflected. Thereby it is prevented that the absorption of light introduces an inefficiency in the solid state light emitter package 200.

In a more advanced embodiment of the thermal element 250, the thermal element 250 is a heat conductor and is relatively well thermally coupled to the surroundings of the solid state light emitter package 200. This means that the thermal resistance value of the element towards the surroundings may be relatively low, for example, smaller than 40 K/W, or smaller than 30 K/W, or in the range from 20 to 25 K/W. If then, for example, a high ohmic coupling between a bonding wire and a lead frame dissipates 5W, the temperature of the thermal element 250 may raise with about 100 degrees and thereby it is prevented that the thermal element 250 may reach a temperature at which the electrically insulating material starts to carbonize.

The first lead frame 210 has a first edge 212 that is opposite to, or faces, a second edge 222 of the second lead frame 220. The thermal element 250 is arranged in between these two edges 212, 222 and has a length that is about equal to the length of the first edge 212 and/or of the second edge 222. In the example of FIG. 2a, the first edge 212 and the second edge 222 are arranged in parallel to each other and completely overlap (seen in a projection of a virtual vertical line in the orientation of FIG. 2a). The thermal element 250 extends over the whole length of the overlapping length of the first edge 212 and the second edge 222. This means that all shortest paths from the first edge 212 to the second edge 222 intersect with the thermal element 250.

The support element 240 at least provides support to the first lead frame 210 and the second lead frame 220. The support element 240 may have more functions, such as providing a housing for the solid state light emitter element 200 in a manner that is known to the skilled person, see, for example, the prior art example of FIG. 1a. The support element 240 may be made of an electrically isolating material. The material of the support element may be a synthetic and/or plastic material. The support element 240 may be made by means of a molding technology. In the example of FIGS. 2a and 2b, the support element 240 also provides the electrically insulating material in between the first lead frame 210 and the thermal element 250 and in between the second lead frame 220 and the thermal element 250. In other words, the electrically insulating material 242, 244 is an integral part of the support element 240. Additionally, the support element 240 may have reflective surfaces to prevent that the support element 240 absorbs light. The reflective surfaces are at least the surfaces on which light may impinge that is emitted by the solid state light emitter die 230 or an optional phosphor element. The reflective surfaces may be diffusely reflective or specularly reflective. The support element 240 may be made, for example, of a white synthetic material that is diffusely reflective.

Bonding wire 260 bridges the area in between the first lead frame 210 and the second lead frame 220 and is coupled at one end to the solid state light emitter die 230 and at another end to the second lead frame 220. Thereby, seen in a top view, the bonding wire 260 is in front of the thermal element 250 and the electrically insulating materials 242, 244. Bonding wires 260, 262 may be golden wires or wires that are provided with a gold coating. The bonding wires 260, 262 may also be made of another electrically conductive material such as copper, silver or aluminum. The bonding wires are coupled at their ends (e.g. 261, 263) to, for example, one of the lead frames 210, 220 or to the solid state light emitter die 230. The coupling may be made by a sort of soldering technology or a sintering technology. The coupling may be made by standard wire bonding technology. Here, the wire is attached at both ends using a combination of downward pressure, ultrasonic energy, and in some cases heat, to make a weld. In general, the surface of the bonding wires 260, 262 are reflective such that it does not absorb much light and such that it does not contribute to an inefficiency of the solid state light emitter package 200. The bonding wires 260, 262 are often relatively thin.

Optionally a phosphor element is provided. The phosphor element is not shown in the figures. It may be a phosphor element is provided directly on top of the solid state light emitter die 230 or that it is provided at the light exit window of the solid state light emitter package 200 (as is shown, for example, in FIG. 1a). The phosphor element may comprise luminescent element that converts at least a portion of the light that is emitted by the solid state light emitter die 230 towards light of another color.

FIG. 2b schematically shows a cross-sectional view of the first embodiment of the solid state light emitter package 200 of FIG. 2b along line IIb-IIb'. The cross-sectional view shows the first lead frame 210, the second lead frame 220, the thermal element 250, the solid state light emitter die 230 that is provided with an electrically isolated attachment layer 232 to the second lead frame 220, the electrically insulating materials 242, 244 that are part of the shown support element 240 and the bonding wires 260, 262 that are coupled with coupling points 261, 263 to other elements of the solid state light emitter package 200. As discussed above, the support element 240 may also have a different shape such that it forms a housing for the solid state light emitter package 200 this means in practical embodiments that the areas that are indicated in FIG. 2b with 240 may form an upstanding walls 298 into an upwards direction (wherein, in the presented drawing of FIG. 2b, the upwards direction is a direction towards the top of the figure). In FIG. 2b, the lead frames 210, 220 are drawn with a rectangular cross-sectional shape. They also may have slightly different cross-sectional shapes. For example, the lead frames 210, 220 may have in the area where they contact the support element 240 a thinner thickness such that the support element 240 may have one or more rims that extends for a short distance under and/or over the lead frames 210, 220 to support the lead frames 210, 220 and to fasten them in the support element 240. The thermal element 250 is also drawn with a rectangular cross-sectional shape, but that may also be different in practical embodiments where the thermal element 250 must be supported and connected to the support element 240.

Figure 3A:
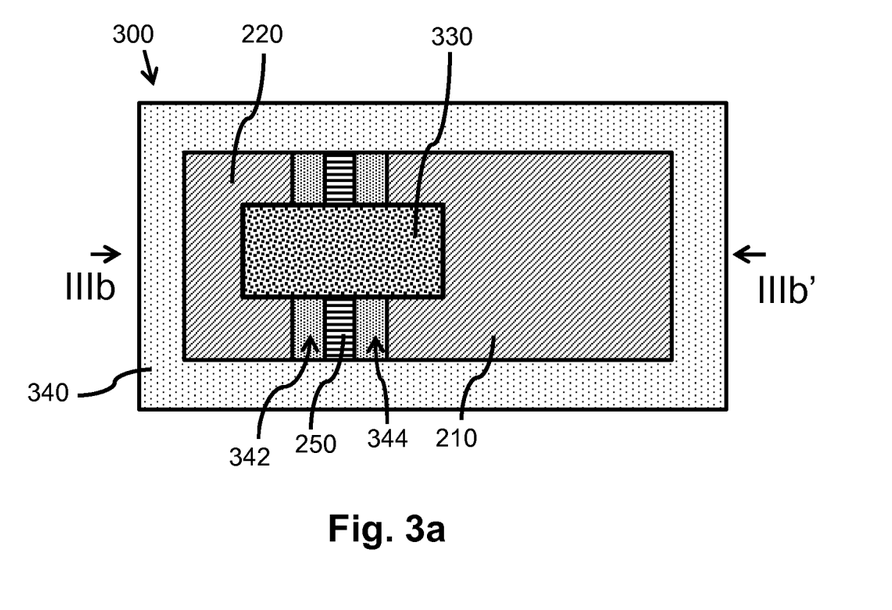
Figure 3B:
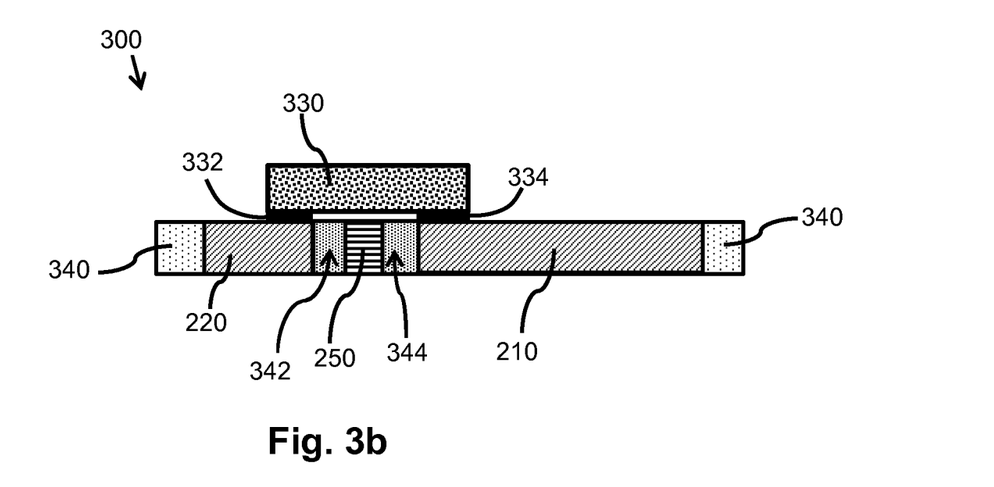

FIG. 3a schematically shows a top view of a second embodiment of a solid state light emitter package 300. FIG. 3b schematically shows a cross-sectional view of the second embodiment of the solid state light emitter package 300 of FIG. 3a along line IIIb-IIIb'. Solid state light emitter package 300 is similar to solid state light emitter package 200 and may have similar embodiments that have similar effects and advantages as discussed in the context of FIG. 2a. Differences are discussed hereinafter and a discussion of the elements that are similar or equal is provided in the context of FIG. 2a.

In solid state light emitter package 300 there are no bonding wires and, thus, none of the bonding wires bridges the area in between the first lead frame 210 and the second lead frame 220. In solid state light emitter package 300 the provided solid state light emitter die 330 bridges the area in between the first lead frame 210 and the second lead frame 220. In solid state light emitter package 300 the electrically insulating materials 342, 344 are not an integral part of support element 340 and may be made of a different material than the support element 340. It is to be noted that using the solid state light emitter die 330 as a bridging element and providing a support structure 340 that is provided separately from the electrically insulating materials 342, 344 are two variations of the embodiment that may be applied independently of each other to the previously discussed embodiments of the solid state light emitter package 200. Thus, the use of separate insulating materials 342, 344 in between the lead frames 210, 220 and the thermal element 250 may also be used in the context of the solid state light emitter package 200 of FIG. 2a. Thus, the use of a solid state light emitter die 330 that bridges the area in between the lead frames 210, 220 may also be applied to the embodiment of solid state light emitter package 200.

The solid state light emitter die 330 may be a so-termed flip-chip solid state light emitter die. This means that the areas where the die must be coupled to power are at another side than the side where most light is emitted into the ambient. Therefore, solid state light emitter die 330 can be coupled by, for example, solder 334 to the first lead frame 210 and can be coupled by, for example, solder 332 to the second lead frame 220. In the example of FIGS. 3a, 3b, the solder connections 332, 334 raise the bottom surface of the solid state light emitter die 330 above the top level of the electrically isolating materials 342, 344 and the top surface of the thermal element 250 to prevent an electrically contact between the solid state light emitter die 330 and the thermal element 250.

Also in the context of the second embodiment of the solid state light emitter package 300 it is advantageous to have the thermal element 250 in between the lead frames 210, 220. In the context of FIGS. 3a, 3b one of the coupling between the solid state light emitter die 330 and one of the lead frames 210, 220 may be high-ohmic and may, consequently, dissipate quite some power in the coupling alone. Thereby the one of the lead frames may become too hot and one of the electrically insulating materials 342, 344 may carbonize. The thermal element 250 will prevent, or at least will delay, that the other one of the electrically insulating materials 342, 344 carbonizes as well. Thereby the solid state light emitter package 300 is safer.

Figure 4A:
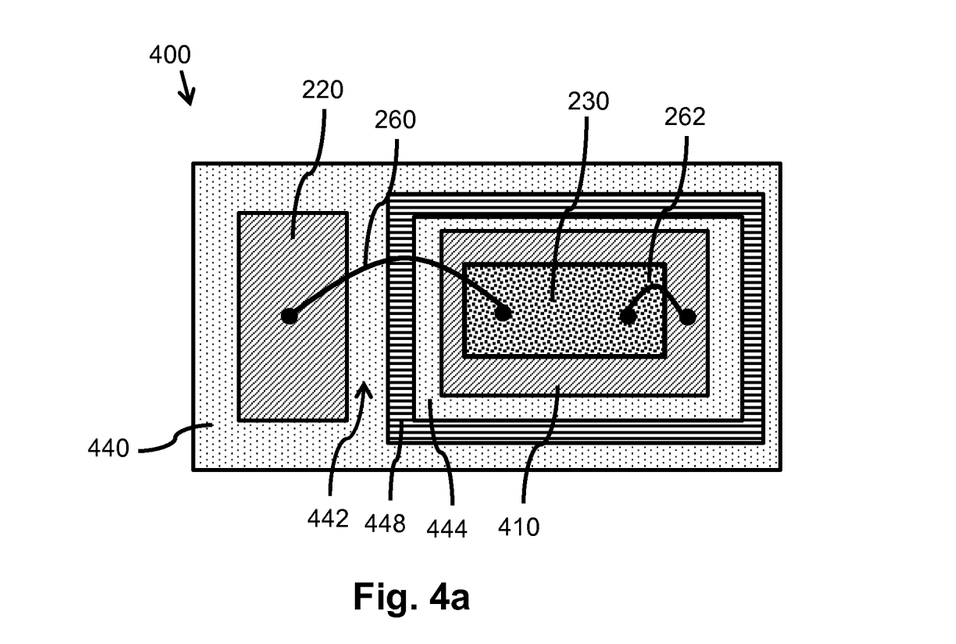

FIG. 4a schematically shows a top view of a third embodiment of a solid state light emitter package 400. Solid state light emitter package 400 is similar to solid state light emitter package 200 and may have similar embodiments that have similar effects and advantages as discussed in the context of FIG. 2a. Differences are discussed hereinafter and a discussion of the elements that are similar or equal is provided in the context of FIG. 2a. Features of the second embodiment of the solid state light emitter package 300 of FIGS. 3a and 3b may also be combined with the presented embodiment.

In the context of solid state light emitter package 400, the first lead frame 410 is smaller and is surrounded, seen in the top view, by an electrically insulating material which is subsequently surrounded, seen in the top view, by a thermal element 448. In between the thermal element 448 and the second lead frame 220 is also an electrically insulating material 442. The electrically insulating materials 442, 444 may be an integral part of a support element 440 or may be separate elements of the same or a different material. The thermal element 448 is a heat absorber or a heat conductor. Embodiments of the heat absorber or the heat conductor are discussed in the context of FIGS. 2a and 2b.

The thermal element 448 is relatively large and as such it may have a higher (absolute) heat capacity to store more heat, it may be better capable of conducting heat to a larger volume and it may be better capable of conducting heat towards the surroundings of the solid state light emitter package 400. Therefore, in line with a previously provided reasoning, the solid state light emitter package 400 is relatively safe.

Figure 4B:
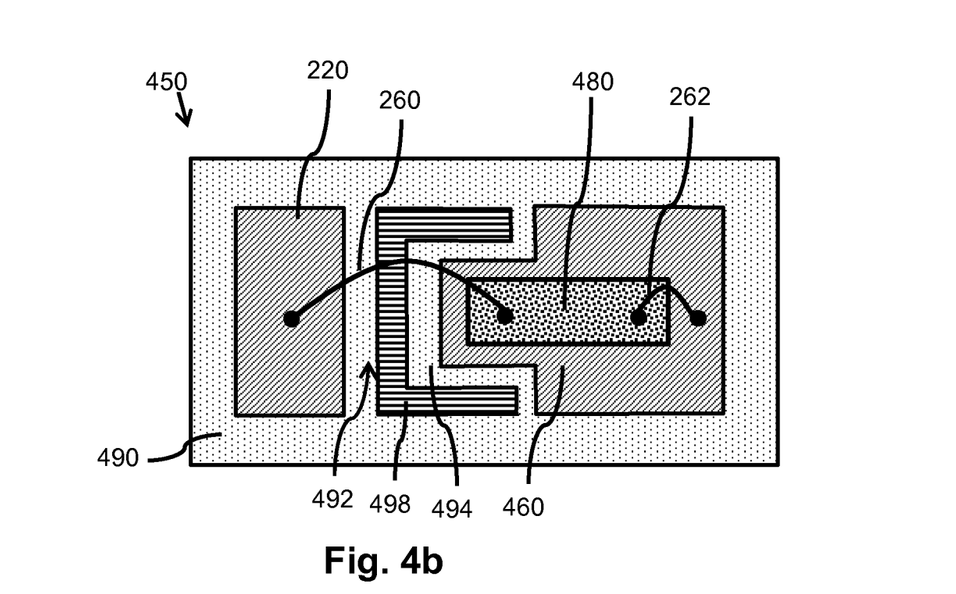

FIG. 4b schematically shows a top view of a fourth embodiment of a solid state light emitter package 450. Solid state light emitter package 400 is similar to solid state light emitter package 200 and may have similar embodiments that have similar effects and advantages as discussed in the context of FIG. 2a. Differences are discussed hereinafter and a discussion of the elements that are similar or equal is provided in the context of FIG. 2a. Features of the second embodiment of the solid state light emitter package 300 of FIGS. 3a and 3b may also be combined with the presented embodiment.

A difference of is that the thermal element 498, the first lead frame 460 and the electrically insulating material 494 have a different shape. The thermal element 498 is, seen in the top view, U-shaped and a portion of the first lead frame 460 extends into the U. In between the portion of the first lead frame 460 that extends into the U and the U-shaped thermal element 498 is provided the electrically insulating material 494. In between the second lead frame 220 and the thermal element 450 is also provide electrically insulating material 492. The electrically insulating materials 492, 494 may be an integral part of the support element 490 or may be separate elements and may be made of the same material as the support element 490 or may be made of another material. The thermal element 498 is a heat absorber or a heat conductor. The shape of the solid state light emitter die 480 may be smaller because of the adapted shape of the first lead frame 460. Embodiments of the heat absorber or the heat conductor are discussed in the context of FIGS. 2a and 2b.

Figure 5A:
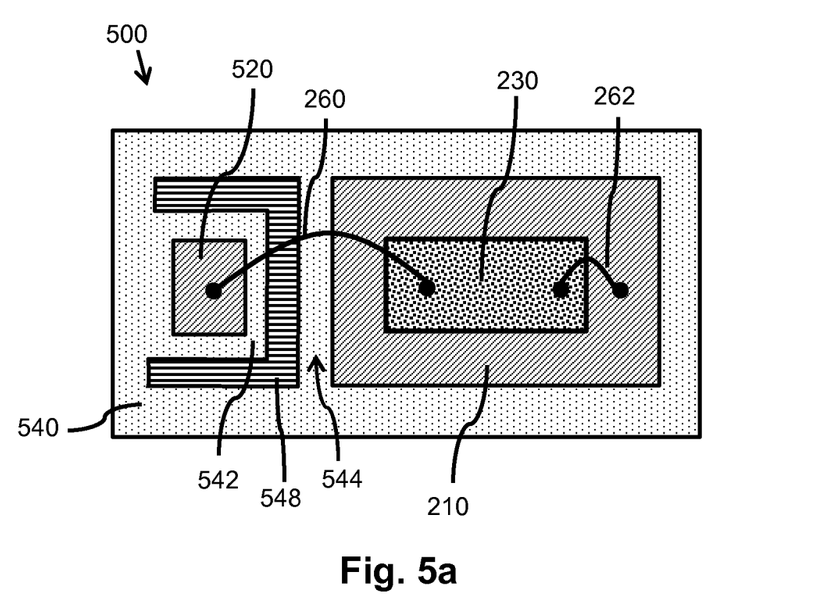

FIG. 5a schematically shows a top view of a fifth embodiment of a solid state light emitter package 500. Solid state light emitter package 500 is similar to solid state light emitter package 200 and may have similar embodiments that have similar effects and advantages as discussed in the context of FIG. 2a. Differences are discussed hereinafter and a discussion of the elements that are similar or equal is provided in the context of FIG. 2a. Features of other embodiments of the solid state light emitter package 300, 400, 450 of FIGS. 3a, 3b, 4a and 4b may also be combined with the presented embodiment.

In the solid state light emitter package 500, the second lead frame 520 is relatively small and provided inside a U-shaped thermal element 548. In between the U-shaped thermal element 548 and the second lead frame 520 is provided an electrically insulating material 542. In between the thermal element 548 and the first lead frame 210 is also provided an electrically insulating material 544. The thermal element 548 is a heat absorber or a heat conductor. Embodiments of the heat absorber or the heat conductor are discussed in the context of FIGS. 2a and 2b. The electrically insulating materials 542, 544 may be an integral part of the support structure 540 or may be separate structures and may be made of the same material as the support structure 540 or of a different material.

Figure 5B:
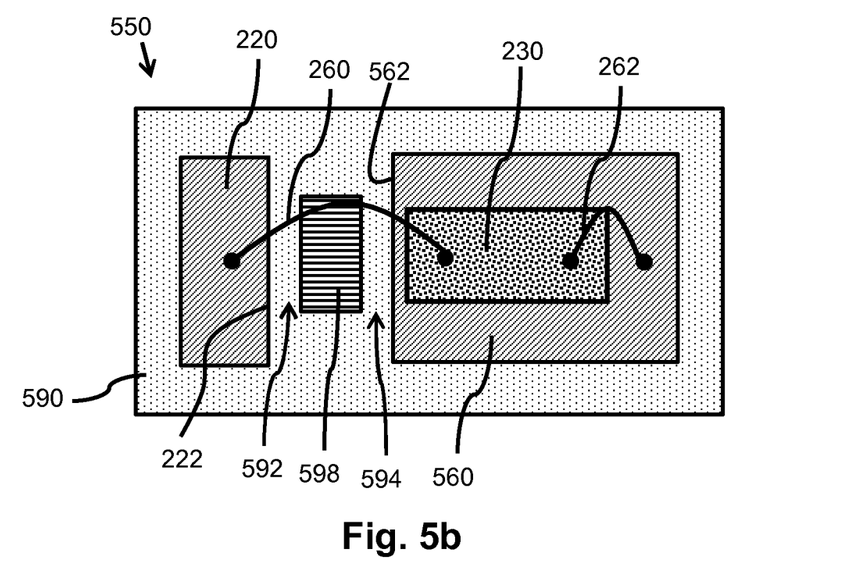

FIG. 5b schematically shows a top view of a sixth embodiment of a solid state light emitter package 550. Solid state light emitter package 550 is similar to solid state light emitter package 200 and may have similar embodiments that have similar effects and advantages as discussed in the context of FIG. 2a. Differences are discussed hereinafter and a discussion of the elements that are similar or equal is provided in the context of FIG. 2a. Also features of other embodiments of the solid state light emitter package 300, 400, 450 of FIGS. 3a, 3b, 4a and 4b may be combined with the presented embodiment.

In comparison to solid state light emitter package 200 of FIGS. 2a and 2b, the first lead frame 560 is smaller and the distance between the first lead frame 560 and the second lead frame 220 is larger. In the example of FIG. 5b, the first lead frame 560 has a first edge 562 that is opposite to, or faces, a second edge 222 of the second lead frame 220. These two edges 222, 562 completely overlap when being projected on a virtual vertical line (that is vertical in the orientation of FIG. 5b), but that is not necessary. In between the relatively large space between the edges 222, 562 a thermal element 598 is provided that is seen in the horizontal direction (in the orientation of FIG. 5b) relatively wide compared to previously discussed thermal elements. Thermal element 598 is in a vertical direction (in the orientation of FIG. 5b) shorter than the first edge 562 and the second edge 222 and is arranged in the vertical dimension (in the orientation of FIG. 5b) somewhere in the middle. The thermal element 598 is relatively large and may therefore prevent that an overheated first lead frame 560 or an overheated second lead frame 220 transfers all this heat along the space in between the two lead frames 220, 560 and thereby it is prevent, or at least delayed, that all electrically insulating material in between the first lead frame 560 and the second lead frame 220 carbonizes.

Figure 6:
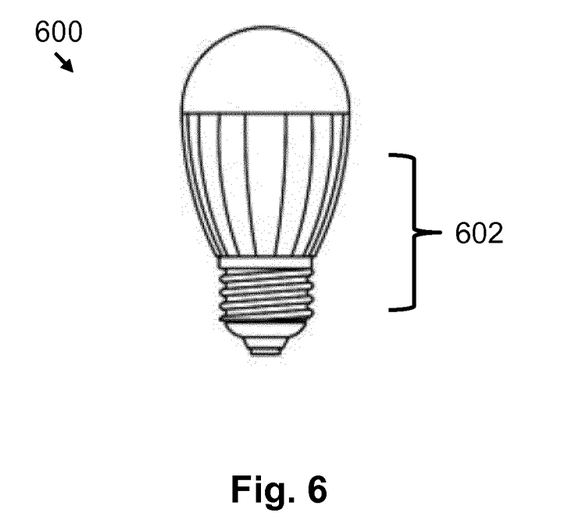

FIG. 6 schematically shows a lamp 600. The lamp 600 is a retro-fit light bulb. Embodiments of the lamp are not limited to retro-fit light bulbs and may relate to all sorts of lamps. The lamp 600 has a bottom part and in this bottom part may be provided one or more solid state light emitter packages according to any one of the previous discussed embodiments of a solid state light emitter package.

Figure 7:
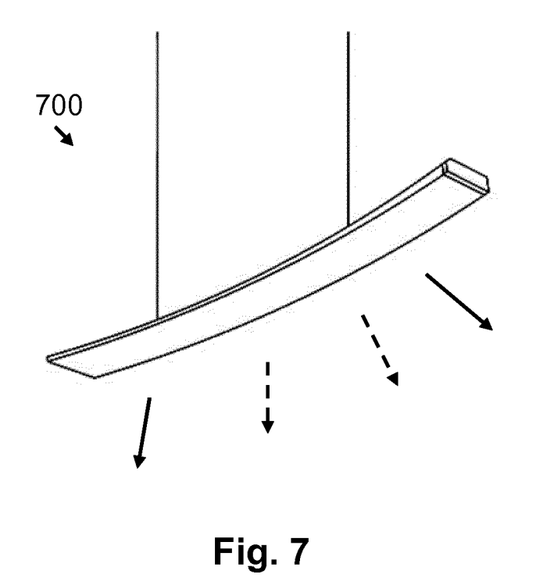

FIG. 7 schematically shows a luminaire 700. The luminaire 700 comprises one or more solid state light emitter packages according to any one of the previously discussed embodiments of a solid state light emitter package. The luminaire 700 may additionally, or alternatively, comprise a lamp according to a previously discussed embodiment of a lamp.

Figure 8:
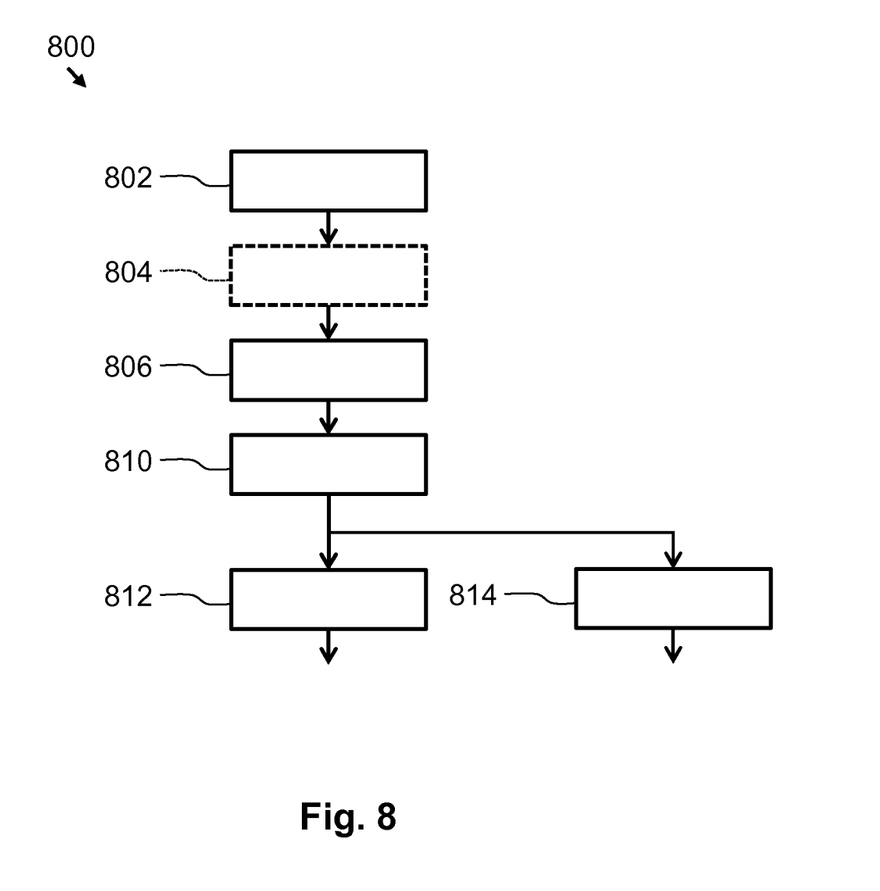
FIG. 8 schematically presents a method of manufacturing a solid state light emitter package.

FIG. 8 schematically presents a method 800 of manufacturing a solid state light emitter package. The method 800 comprises: a) obtaining 802 a first lead frame, a second lead frame, a solid state light emitter die, electrical insulating material and a thermal element, said lead frames being capable of receiving power and conducting the power to the solid state light emitter die, the thermal element being capable of absorbing heat or being capable of spreading heat; b) optionally obtaining 804 a bridging element; c) arranging 806 the first lead frame, the second lead frame, the thermal element and the electrical insulating material such that the first lead frame and the second lead frame are electrically isolated from each other, such that the thermal element is arranged in between the first lead frame and the thermal element is electrically isolated from the first lead frame and the second lead frame by the electrically insulating material; d) arranging 808 the solid state light emitter die in the solid state light emitter package whereby at least a part of the solid state light emitter die is arranged on the first lead frame; and one of: e1) arranging 810 the bridging element, seen in a top view, above the thermal element and the electrically insulating material and arranging the bridging element in contact with the second lead frame and the solid state light emitter die for providing an electrical connection between the second lead frame and the solid state light emitter die; e2) arranging 812 the solid state light emitter die, seen in a top view, above the thermal element and the electrically insulating material and also partially on the second lead frame for an electrical connection between the solid state light emitter die and the second lead frame, wherein the part of the solid state light emitter die that is arranged on the first lead frame is also electrically connected to the first lead frame.

In summary, this document provides a solid state light emitter package, a lamp, a luminaire and a method of manufacturing the solid state light emitter package. The solid state light emitter package comprising a solid state light emitter die, a first and second lead frame, an electrical insulating material, a thermal element and a bridging element. The first and second lead frame are electrically isolated from each other and provide power to said die. Said die is at least partially provided on the first lead frame. The thermal element is in between the first and second lead frame and is electrically isolated by the electrical insulating material from said lead frames. The thermal element is at least one of a heat absorber or a heat spreader. The bridging element bridges the electrical insulating material and the thermal element and provides an electrical connection between said die and the second lead frame.

It will be appreciated that the above description for clarity has described embodiments of the invention with reference to different functional units. However, it will be apparent that any suitable distribution of functionality between different functional units may be used without deviating from the invention. Hence, references to specific functional units are only to be seen as references to suitable means for providing the described functionality rather than indicative of a strict logical or physical structure or organization.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims. Further, the invention is not limited to the embodiments, and the invention lies in each and every novel feature or combination of features described above or recited in mutually different dependent claims.

The invention claimed is:

1. A solid state light emitter package comprising
a solid state light emitter die,
a first lead frame and a second lead frame being electrically isolated from the first lead frame, said lead frames are for receiving power from an external power source and are arranged to provide received power to the solid state light emitter die, the solid state light emitter die being at least partially provided on the first lead frame,
an electrical insulating material,
a thermal element being arranged in between the first lead frame and the second lead frame and being electrically isolated by the electrical insulating material from the first lead frame and from the second lead frame and the thermal element being at least one of a heat absorber or a heat spreader, the thermal element not being in direct thermal contact with the solid state light emitter die, and
a bridging element bridging the electrical insulating material and the thermal element in between the first lead frame and the second lead frame and the bridging element is for obtaining an electrical connection between the solid state light emitter die and the second lead frame
wherein, seen in a virtual plane that follows top surfaces of the first lead frame and the second lead frame, the thermal element at least partially encloses the first lead frame or the second lead frame to delay heat transfer between the first lead frame and the second lead frame.

2. A solid state light emitter package according to claim 1, wherein one edge of the first lead frame is arranged opposite to one edge of the second lead frame and all shortest paths from the one edge of the first lead frame to the one edge of the second lead frame intersect with the thermal element.

3. A solid state light emitter package according to claim 1, wherein the thermal element comprises an U-shape, and the first lead frame or the second lead frame is provided inside the U-shaped thermal element.

4. A solid state light emitter package according claim 1, wherein, seen in a virtual plane that follows top surfaces of the first lead frame and the second lead frame, the first lead frame or the second lead frame is completely surrounded by the thermal element.

5. A solid state light emitter package according to claim 1 comprising a housing component, the housing component being arranged to support the first lead frame, the second lead frame, the thermal element and optionally the solid state light emitter die, and, optionally, the housing component forming the electrically insulating material in between the first lead frame, the thermal element and the second lead frame.

6. A solid state light emitter package according to claim 1 wherein at least one of:
the thermal element is a thermal mass having a high volumetric heat capacitance,
the thermal element is made of a phase change material,
the thermal element is made of material having a relatively high thermal conductivity coefficient, for example, larger than 200 W/mK,
the thermal element is made of a thermally conductive metal.

7. A solid state light emitter package according to claim 1, wherein the thermal element has a thermal resistance to the surroundings of the solid state light emitter package that is lower than 40 K/W.

8. A solid state light emitter package according to claim 1, wherein the bridging element is a first wire bond that is electrically coupled to the second lead frame at one end and is electrically coupled to the solid state light emitter die at the other end.

9. A solid state light emitter package according to claim 8 further comprising a second wire bond that is electrically coupled to the first lead frame at one end and is electrically coupled to the solid state light emitter die at the other end.

10. A solid state light emitter package according to claim 1, wherein the bridging element is formed by the solid state light emitter die that comprises
a first portion that is provided on the first lead frame for forming an electrical connection to the first lead frame,
a second portion that is provided on the second lead frame for forming an electrical connection to the second lead frame, and
a third portion that bridges the electrical insulating material and the thermal element.

11. A lamp comprising a solid state light emitter package according to claim 1.

12. A luminaire comprising a solid state light emitter package according to claim 1.

13. Method of manufacturing a solid state light emitter package comprising
obtaining a first lead frame, a second lead frame, a solid state light emitter die, electrical insulating material and a thermal element, said lead frames being capable of receiving power and conducting the power to the solid state light emitter die, the thermal element being capable of absorbing heat or being capable of spreading heat, the thermal element not being in direct thermal contact with a solid state light emitter die,
optionally, obtaining a bridging element,
arranging the first lead frame, the second lead frame, the thermal element and the electrical insulating material such that the first lead frame and the second lead frame are electrically isolated from each other, such that the thermal element is arranged in between the first lead frame and the thermal element is electrically isolated from the first lead frame and the second lead frame by the electrically insulating material,
arranging the solid state light emitter die in the solid state light emitter package whereby at least a part of the solid state light emitter die is arranged on the first lead frame, and one of:
arranging the bridging element, seen in a top view, above the thermal element and the electrically insulating material and arranging the bridging element in contact with the second lead frame and the solid state light emitter die for providing an electrical connection between the second lead frame and the solid state light emitter die,
arranging the solid state light emitter die, seen in a top view, above the thermal element and the electrically insulating material and also partially on the second lead frame for an electrical connection between the solid state light emitter die and the second lead frame, wherein the part of the solid state light emitter die that is arranged on the first lead frame is also electrically connected to the first lead frame
wherein, seen in a virtual plane that follows top surfaces of the first lead frame and the second lead frame, the thermal element at least partially encloses the first lead frame or the second lead frame to delay heat transfer between the first lead frame and the second lead frame.

* * * * *